United States Patent [19]

Suzuki

[11] Patent Number: 5,189,539
[45] Date of Patent: Feb. 23, 1993

[54] DRIVE LINE WIRING FOR LIQUID CRYSTAL DISPLAY

[75] Inventor: Hiroshi Suzuki, Fujisawa, Japan

[73] Assignee: International Business Machines Corporation, Armonk, N.Y.

[21] Appl. No.: 729,085

[22] Filed: Jul. 12, 1991

[30] Foreign Application Priority Data

Jul. 12, 1990 [JP] Japan .................................. 2-182895

[51] Int. Cl.$^5$ .............................................. G02F 1/13
[52] U.S. Cl. .......................................... 359/87; 359/88
[58] Field of Search ........................... 359/87, 88, 89

[56] References Cited

U.S. PATENT DOCUMENTS

| | | | |
|---|---|---|---|
| 4,012,117 | 3/1977 | Lazzery | 359/88 |
| 4,183,629 | 1/1980 | Nishimura et al. | 359/88 |
| 4,435,046 | 3/1984 | Nishimura | 359/88 |
| 4,457,589 | 7/1984 | Tamura et al. | 359/88 |
| 4,545,647 | 10/1985 | Sasaki et al. | 359/88 |
| 4,655,551 | 4/1987 | Washizuka et al. | 359/88 |

FOREIGN PATENT DOCUMENTS 0208634  8/1990  Japan ...................................... 359/88

*Primary Examiner*—William L. Sikes
*Assistant Examiner*—Huy K. Mai
*Attorney, Agent, or Firm*—David Aker

[57] ABSTRACT

A wiring arrangement suitable for use in a liquid crystal display wherein a series of first elements, such as pixels, are electrically connected to a series of second elements, such as connection electrodes by a series of leads. A minimum spacing permitted by packaging process considerations is maintained between the leads. The spacing between successive ones of the second elements increases as an end of the series of second elements is reached.

14 Claims, 3 Drawing Sheets

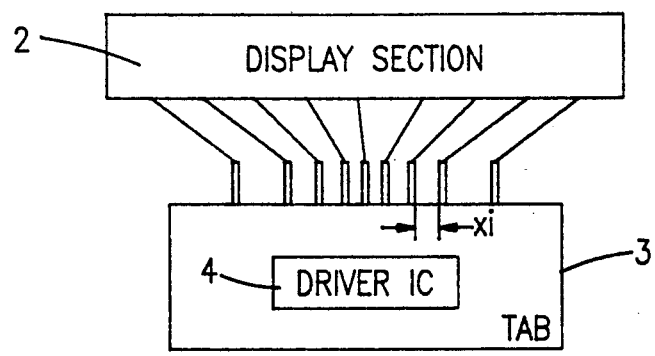
FIG.4
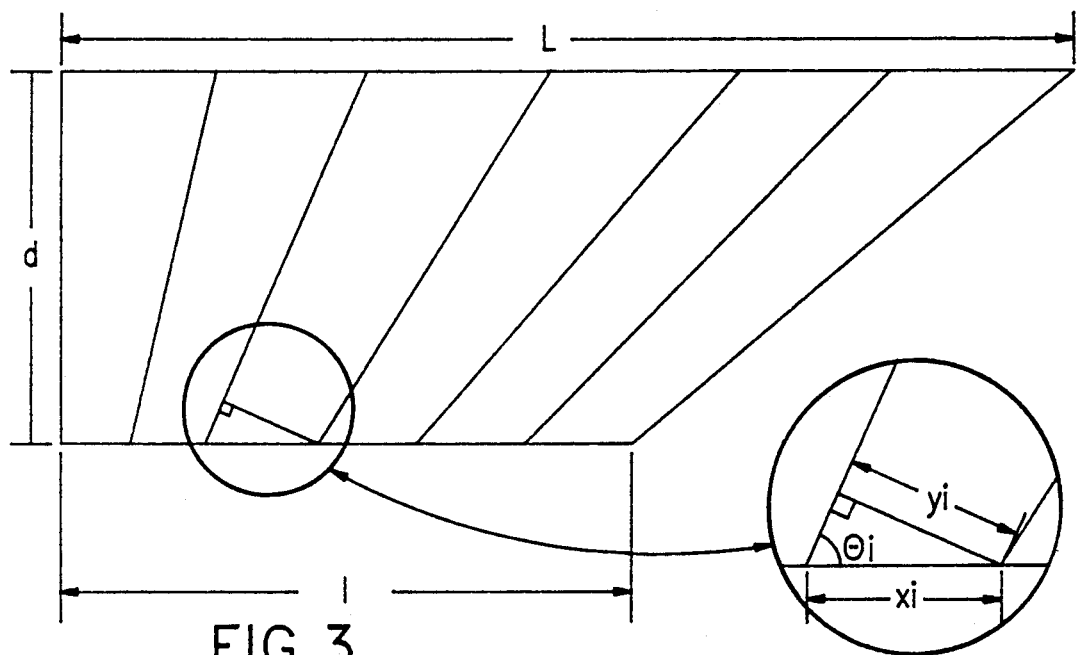
FIG.3
FIG.3A
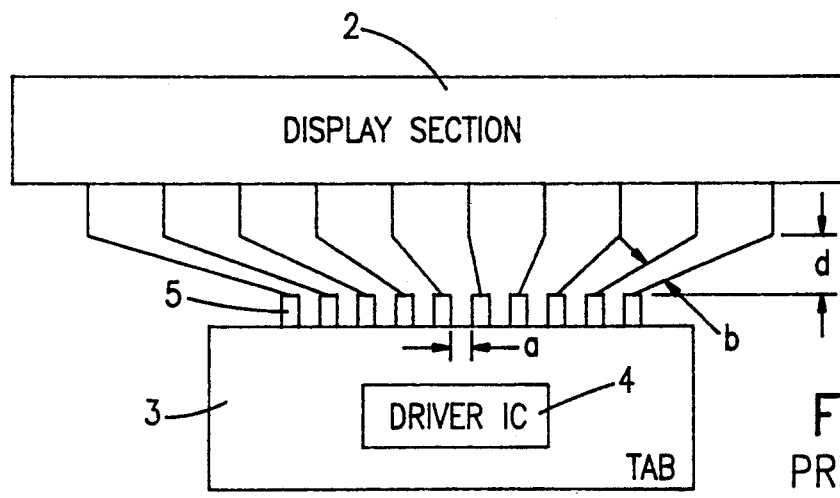
FIG.2
PRIOR ART

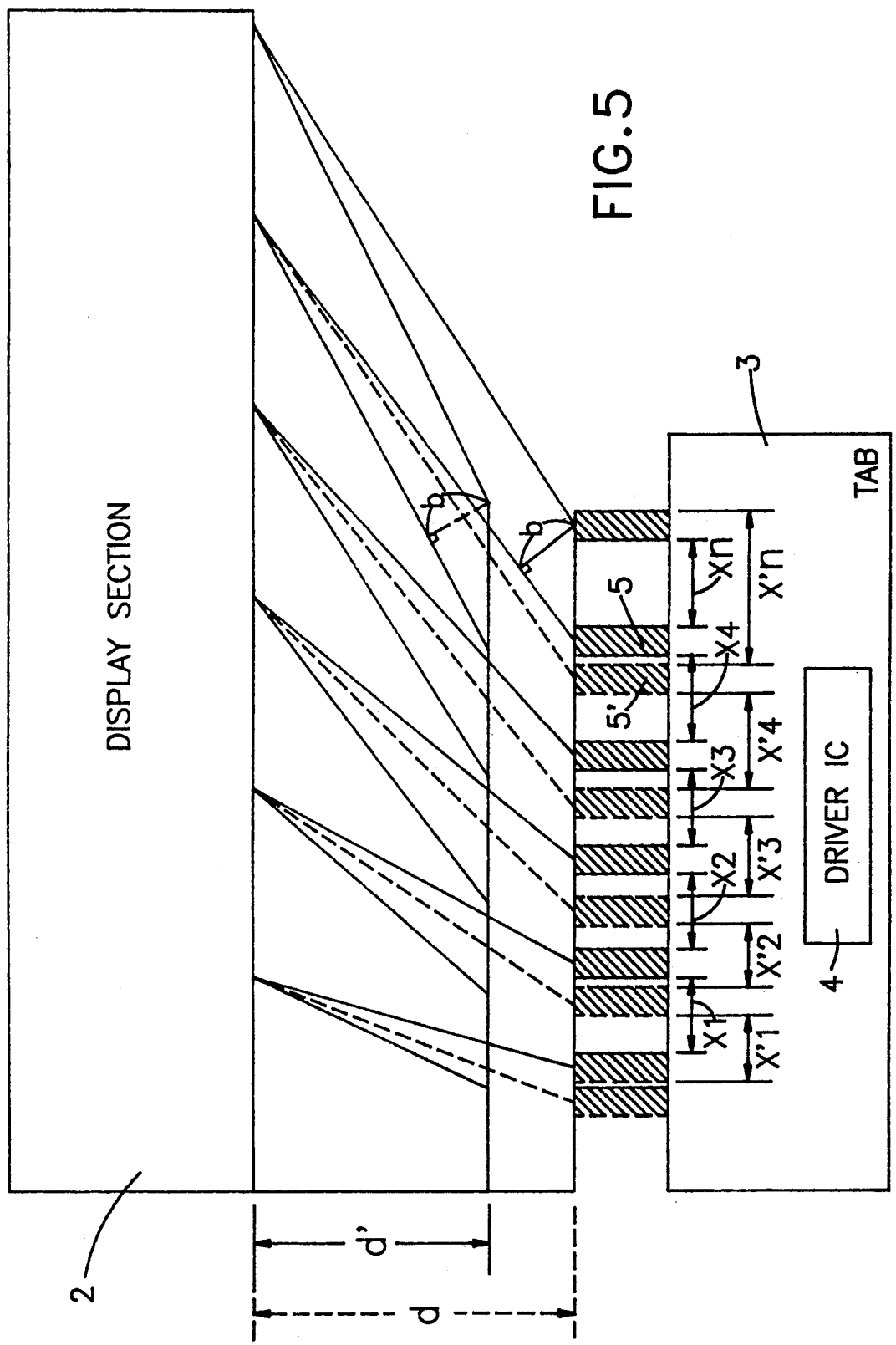

DRIVE LINE WIRING FOR LIQUID CRYSTAL DISPLAY

TECHNICAL FIELD

This invention relates to liquid crystal displays (LCD's). More particularly it relates to an improvement in the wiring of the LCD drive lines which drive the liquid crystal cells to display information.

BACKGROUND ART

Development of active matrix type LCD's using thin film transistors (TFT's) that drive liquid crystal cells arranged in a matrix, has been occurring at an increasing rate in recent years.

FIG. 1 is a plan view of a typical active matrix type LCD. A display section 2, consisting of a large number of pixels 7a, 7b, ... and TFT elements that drive each pixel, is mounted on a glass substrate 1. Connection electrodes 5 are formed at predetermined positions along the top and bottom edges and the left and right edges of glass substrate 1. These electrodes 5 are in turn connected to the connection electrodes of a tape-like member, on which a driver integrated circuit (IC) 4 is mounted. For example, TAB (Tape Automated Bonding material) may be used as the tape-like member. Terminals of TAB 3 are connected to a printed circuit board (PCB) 8. The PCB 8 is supported by the glass substrate 1. Drive sections 6y, consisting of a predetermined number (two in FIG. 1) of TAB's 3y in the y direction, are provided on both the top and bottom sides of the display panel. Also, drive sections 6x, consisting of a predetermined number (five in FIG. 1) of TAB's 3x in the x direction, are provided at both the right and the left sides of the display panel. At the four corners of the display panel, connectors 9 are provided to supply signals to the drive sections 6x and 6y from external circuits (not shown). Further, each pixel 7a, 7b ... is connected to both electrodes 5x and 5y in the x direction and y direction, respectively. An enlargement of a proportion of FIG. 1 illustrating the connection of a TAB 3 (in the x or in the y direction) and the display section is shown in FIG. 2.

Conventionally, the connection electrodes 5 for connecting the drive lines on glass substrate 1 of the LCD and a driver IC 4, are positioned with uniform spacing "a," as shown in FIG. 2. If this is the case, the spacing "b" between the leads to the connection electrodes 5 is smallest for the electrodes 5 at the extreme right or left ends (the outermost electrodes). When the wiring distance "d" on the glass substrate from the display section to the connection electrodes 5 is set so that the spacing between the leads will not fall below the value permitted by the packaging process, the wiring space is unnecessarily wide at the center of the TAB.

In other word, when the wiring distance "d" on the glass substrate from the display section to the connection electrodes 5 is defined so that the space between the leads is not below a permitted value at the extreme left or right hand side of the series of connection electrodes 5, the spacing between successive connection electrodes 5 at the center become unnecessarily large (as compared to the ends), and the wiring arrangement thus occupies excessive space.

SUMMARY OF THE INVENTION

It is an object of the invention to provide a compact LCD.

It is a further object of the invention to provide an LCD wherein the wiring to the connection electrodes and the spacing between the wires or leads occupy the smallest possible space.

In accordance with the invention the spacing between the adjacent connection electrodes is not constant. Instead, the spacing is progressively enlarged from the center, where it is smallest, to both ends, where it is largest.

BRIEF DESCRIPTION OF THE DRAWINGS

FIG. 2 is an enlarged view of a conventional wiring arrangement of the LCD of FIG. 1.

FIG. 3 is a view explaining the principles of the invention.

FIG. 4 is an enlarged view of a portion of the wiring arrangement of a liquid crystal panel in accordance with an embodiment of the invention.

FIG. 5 illustrates a comparison of an LCD having wiring in accordance with the invention and the wiring of a conventional LCD.

DETAILED DESCRIPTION OF THE PREFERRED EMBODIMENT

Figure 1:
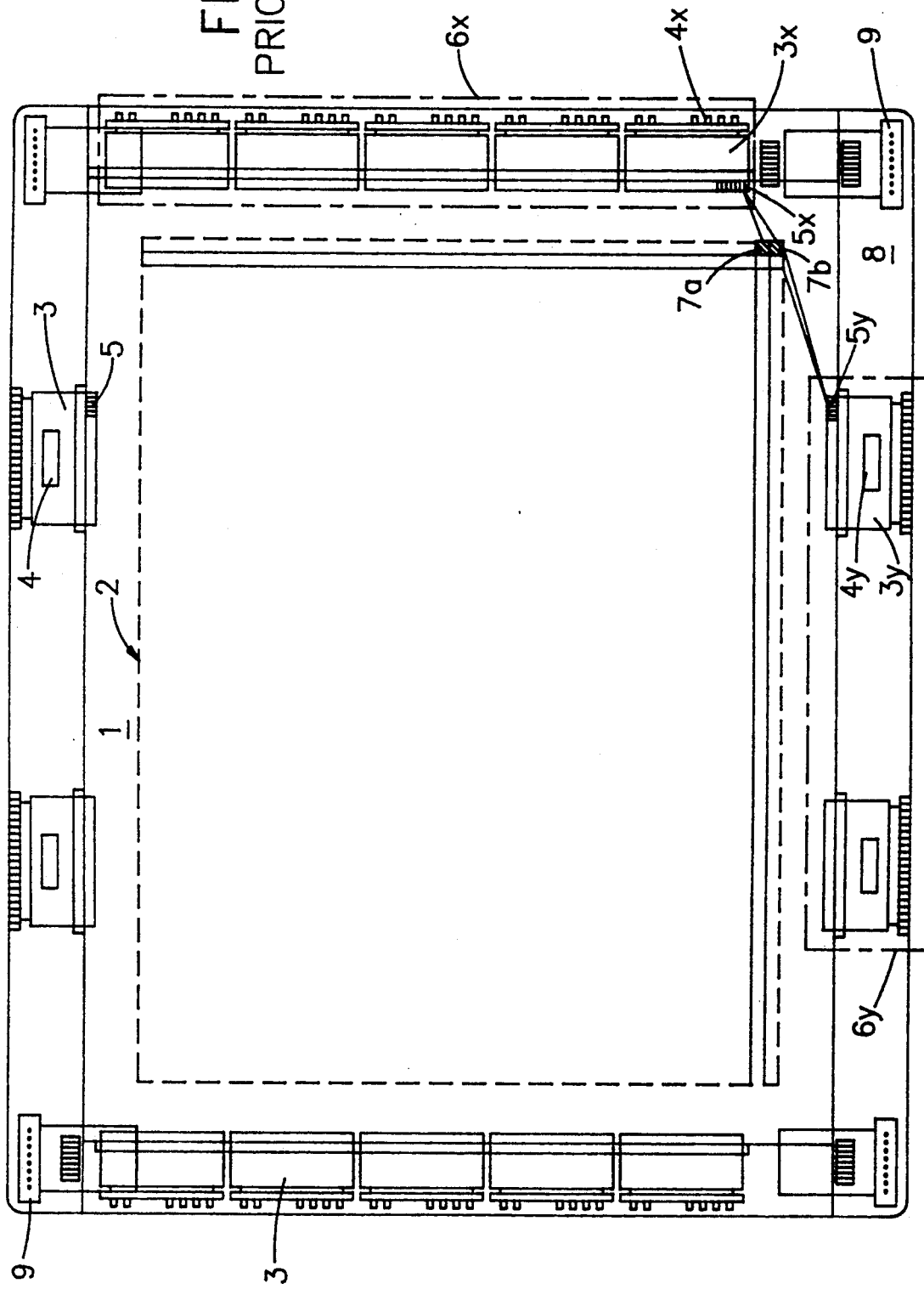
FIG. 1 is a plan view of portions of a typical LCD.

Reference is made to FIG. 3 to illustrate the principles of the invention. The following parameters are defined with respect to FIG. 3:

L = the length of display section 2 (center to right end);
L/n = the pitch between pixels;
d = the wiring distance on the glass substrate;
Yi = the minimum pitch between the leads;
Xi = the distance between the connection electrodes 5;
$\theta i$ = the angle between the lead and the top of the connection electrode 5; and
l = the total distance between the connection electrodes, from the center electrode to the rightmost electrode.

The following relationships exist between the parameters:

$$\left( i\left(\frac{L}{n}\right) - \sum_{k=1}^{i} Xk \right) \tan\theta i = d \quad (1)$$

$$\sum_{k=1}^{n} Xk = 1 \quad (2)$$

The minimum value of Yi at each lead may be expressed as:

$$yi = xi \sin \theta i \quad (3)$$

In accordance with the invention the pitch Xi of the connection electrodes may be defined as a constant for i = 1, 2, ..., n. Thus $$yi = xi \sin \theta i = \text{constant} \quad (4)$$

If the connection electrode pitch Xi satisfies equations (1)–(4) above, the wiring pitch Xi becomes wider going from the center of TAB 3 to both ends as shown in FIG. 4.

Referring to FIG. 5, the conventional wiring method is compared to the wiring method according to the invention. Conventional wiring is indicated by solid lines, and wiring in accordance with the invention is indicated by dashed lines. The connection electrodes 5 mounted on TAB 3 are positioned as indicated. The pitch $X1-Xn$ of the connection electrodes are $X1=X2=\ldots=Xn$ in the conventional case. In accordance with the invention, the connection electrodes 5' are positioned as indicated by dashed lines, and the pitch $X'1-X'n$ of the connection electrodes satisfy the relationship $X'1<X'2<\ldots<X'n$. If the minimum wiring pitch is set equal to the minimum wiring pitch used in the conventional method, it is possible for wiring distance "d" to be decreased to d'.

For a given wiring distance "d," a given minimum wiring pitch "b" and a given minimum connection electrode pitch Xi, the space between adjacent electrodes becomes larger than that at the center as the left end and the right end of the TAB are reached.

Further, the same result can be achieved by dividing the number of connection electrodes into predetermined groups, and setting the pitch between adjacent electrodes so that the pitch in each and every group is approximately equal to, but no less than the permitted minimum pitch value.

In accordance with the invention, it is possible for the entire liquid crystal panel to be 285 mm×230 mm in size, while the display section 2 has a size of 211.2 mm×158.4 mm.

If each pixel electrode has a size of 0.33 mm×0.33 mm and a 35 mm TAB is used to connect to the connection electrodes of a liquid crystal panel having the dimensions set forth above, the wiring distance "d" is 10 mm, the pitch between the connection electrodes near the center of the TAB is 0.15 mm, and it gradually increases as both ends are reached, where the pitch is 0.33 mm.

The invention is not limited to the above values used, but by setting the pitch between the connection electrodes as specified, many other values can also be attained.

Thus, the invention reduces the area of the glass substrate that does not contribute to the display of information by arranging the connection electrodes used to connect the display section and the driver IC mounted on the TAB so that the pitch between the adjacent pixels is widened as it approaches both ends. This makes the LCD structure more compact. In addition, by reducing the size of the required glass substrate, it lowers the cost.

What is claimed is:

1. A wiring arrangement comprising;
   a first series of n elements which are spaced at equal distances along a first line along a length L;
   a second series of n elements which are spaced along a second line parallel to said first line along a length l, where l is shorter than L; and
   n leads, each lead being for connecting one of said first series of elements to one of said second series of elements;
   wherein a first spacing between successive pairs of said leads measured in a direction substantially perpendicular to a lead of said pair of leads, is constant from lead pair to lead pair; and
   wherein a second spacing between successive pairs of said second series of elements becomes progressively larger towards at least one end of said second series of elements.

2. The arrangement of claim 1 wherein successive ones of said first series of elements are connected to successive ones of said second series of elements by successive ones of said leads.

3. The arrangement of claim 1 wherein spacing between successive ones of said second series of elements becomes progressively larger towards both ends of said second series of elements.

4. The arrangement of claim 1 where none of said leads cross one another.

5. The arrangement of claim 1 wherein said first spacing is selected so as to be no smaller than a minimum permitted spacing between said leads.

6. A liquid crystal display having a wiring arrangement comprising:
   a first series of n elements which are spaced at equal distances along a first line along a length L;
   a second series of n elements which are spaced along a second line parallel to said first line along a length l, where l is shorter than L; and
   n leads, each lead being for connecting one of said first series of elements to one of said second series of elements;
   wherein a first spacing between successive pairs of said leads, measured in a direction substantially perpendicular to a lead of said pair of leads, is constant from lead pair to lead pair; and
   wherein a second spacing between successive pairs of said second series of elements becomes progressively larger towards at least one end of said second series of elements.

7. The liquid crystal display of claim 6 further comprising a display section, and wherein:
   said first series of elements are elements of said display section; and
   said second series of elements are connection electrodes formed on said display section.

8. The liquid crystal display of claim 7 further comprising a driving means for supplying driving signals for said display section; and electrical connection means for electrically connecting said driving means to said series of electrodes.

9. The liquid crystal display of claim 8 wherein said driving means is an integrated circuit and said electrical connection means is a tape-like member, said integrated circuit being mounted on said member.

10. The liquid crystal display of claim 9, wherein said tape-like member is tape automated bonding material.

11. The liquid crystal display of claim 6 wherein each of said first series of elements is a liquid crystal display cell and each of said second series of elements is a connection electrode for said cell.

12. The liquid crystal display of claim 6 wherein successive ones of said first series of elements are connected to successive ones said second series of elements by successive ones of said leads.

13. The liquid crystal display of claim 6 wherein spacing between successive ones of said second series of elements becomes progressively larger towards both ends of said second series of elements.

14. The liquid crystal display of claim 6 where none of said leads cross one another.

* * * * *